United States Patent
Jones, Jr.

(10) Patent No.: US 7,583,142 B1
(45) Date of Patent: Sep. 1, 2009

(54) LOW SKEW DIFFERENTIAL AMPLIFIER USING TAIL VOLTAGE REFERENCE AND TAIL FEEDBACK

(75) Inventor: Oscar Frederick Jones, Jr., Colorado Springs, CO (US)

(73) Assignee: ProMOS Technologies Pte.Ltd, Singapore (SG)

( * ) Notice: Subject to any disclaimer, the term of this patent is extended or adjusted under 35 U.S.C. 154(b) by 0 days.

(21) Appl. No.: 12/053,401

(22) Filed: Mar. 21, 2008

(51) Int. Cl.
*H03F 3/45* (2006.01)
(52) U.S. Cl. ...................................... 330/253; 330/261
(58) Field of Classification Search ................ 330/253, 330/261, 257, 310, 150, 98
See application file for complete search history.

(56) References Cited

U.S. PATENT DOCUMENTS 6,512,400 B1 * 1/2003 Forbes ......................... 327/66
6,967,532 B2 * 11/2005 Tan ............................. 330/253
7,274,254 B2 * 9/2007 Hsieh .......................... 330/51

* cited by examiner

*Primary Examiner*—Henry K Choe
(74) *Attorney, Agent, or Firm*—Peter J. Meza; William J. Kubida; Hogan & Hartson LLP

(57) ABSTRACT

Using the tail level referencing for an inverter stage immediately following a differential amplifier provides trip point tracking with the variations in magnitude of the output level swings on the differential amplifier stage output over the operating range of the circuit. When the tail voltage increases and the $V_{OL}$ of the differential stage increases, the trip point of the receiving inverter also increases. When the tail voltage decreases and the $V_{OL}$ of the differential amplifier goes lower, the trip point of the inverter decreases. An additional benefit is provided by the tail connection to the inverter. Faster switching of current from the right side to the left side of the differential amplifier occurs due to the tail node voltage being raised momentarily by a transistor in the inverter stage when the input of the inverter stage transitions high.

21 Claims, 2 Drawing Sheets

LOW SKEW DIFFERENTIAL AMPLIFIER USING TAIL VOLTAGE REFERENCE AND TAIL FEEDBACK

BACKGROUND OF THE INVENTION

The present invention relates to differential amplifier circuits and more particularly to a low skew design for a differential amplifier.

The transition times of low-to-high and high-to-low transitions from the output side of the differential amplifier (see FIG. 1) are significantly different. At high frequencies, this difference can be relatively large. The output of the differential stage transitions from VCC (supply voltage) for a high level to a $V_{DS}$ drop above the tail voltage for a low level. Since the tail voltage changes over operating conditions, the skew of the output buffer changes when a ground referenced ratioed inverter is used for receiving the output of the differential amplifier stage.

FIG. 1 shows a typical differential amplifier and gated output inverter circuit combination 100. A differential amplifier includes inputs IN and IN-bar, and an output node OUTBI, as well as a bias switch input BIAS. The differential amplifier includes N-channel transistors M0 and M5 for receiving the IN and IN-bar signals, an active load including P-channel transistors M12 and M14 for providing the OUTBI output signal, N-channel transistor M32 for receiving the BIAS voltage and supplying the tail current, and cascode N-channel transistor M6. The TAIL node is shown as the junction between transistors M0, M5, and M32. The output inverter comprises P-channel transistor M48 and N-channel transistor M58 in a known inverter configuration. The output N1 of the switched inverter is buffered through serially coupled inverter stages 12, 13, and 14 to provide the circuit output OUTB. Note in FIG. 1 that the source of N-channel transistor M58 is coupled to ground.

What is desired therefore is a low skew design for a differential amplifier that significantly reduces the problem with the prior art differential amplifier design described above but keeping any additional circuitry to an absolute minimum.

SUMMARY OF THE INVENTION

According to the present invention, using the tail level referencing for an inverter stage immediately following a differential amplifier provides trip point tracking with the variations in magnitude of the output level swings on the differential amplifier stage output over the operating range of the circuit (voltage, temperature, amplitude of input swing, input common mode range, etc.). When the tail voltage increases and the $V_{OL}$ of the differential stage increases, the trip point of the receiving inverter also increases. When the tail voltage decreases and the $V_{OL}$ of the differential amplifier goes lower, the trip point of the inverter decreases. An additional benefit is provided by the tail connection to the inverter. Faster switching of current from the right side to the left side of the differential amplifier occurs due to the tail node voltage being raised momentarily by a transistor in the inverter stage when the input of the inverter stage transitions high.

According to the present invention, a low skew differential amplifier circuit includes a differential amplifier and an inverter coupled to the differential amplifier, wherein the switching point of the inverter tracks the midpoint of the output swing of the differential amplifier.

DETAILED DESCRIPTION

Figure 1:
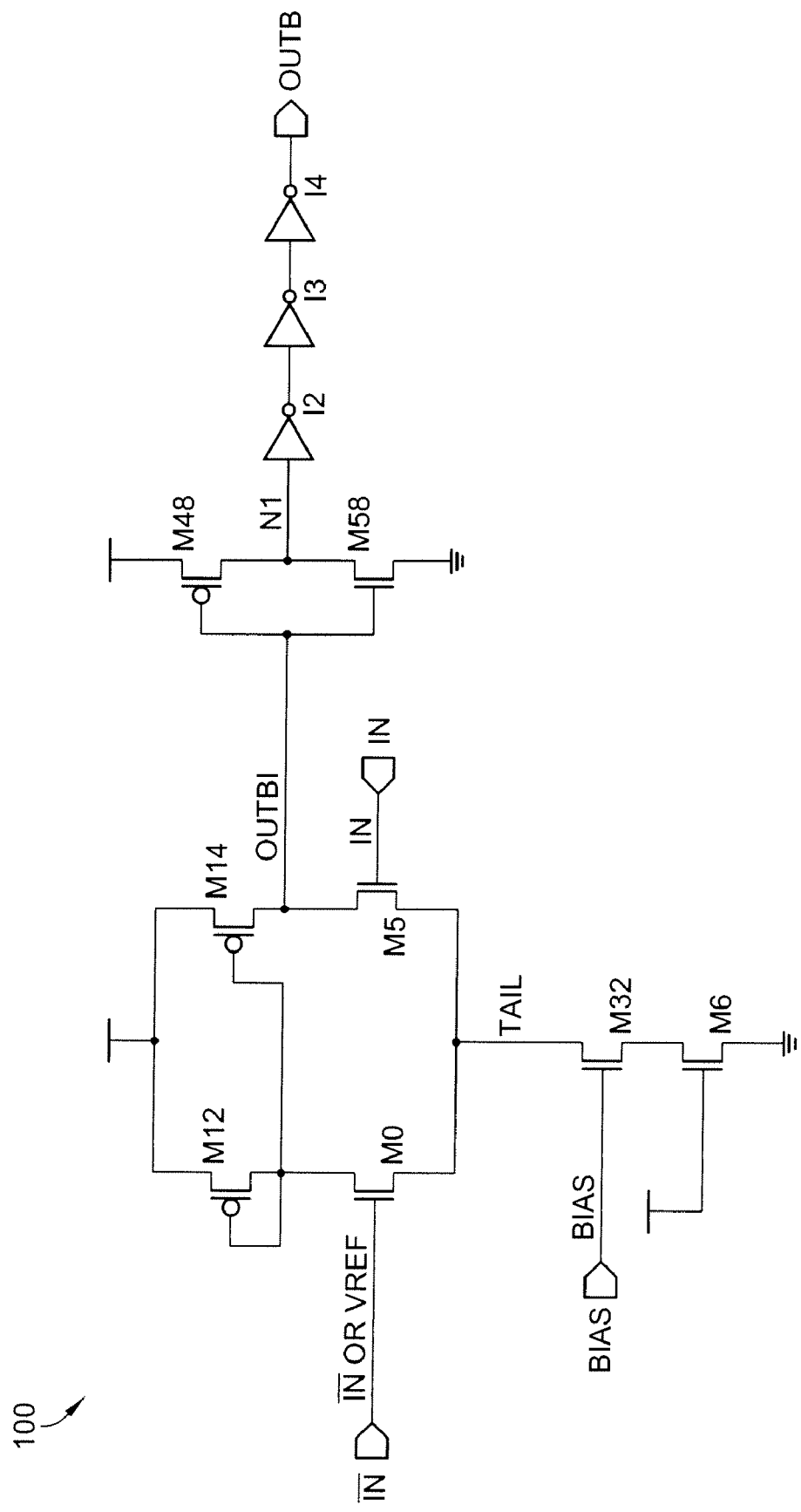
FIG. 1 is a schematic diagram of a prior art circuit including a differential amplifier and a receiving inverter.
Figure 2:
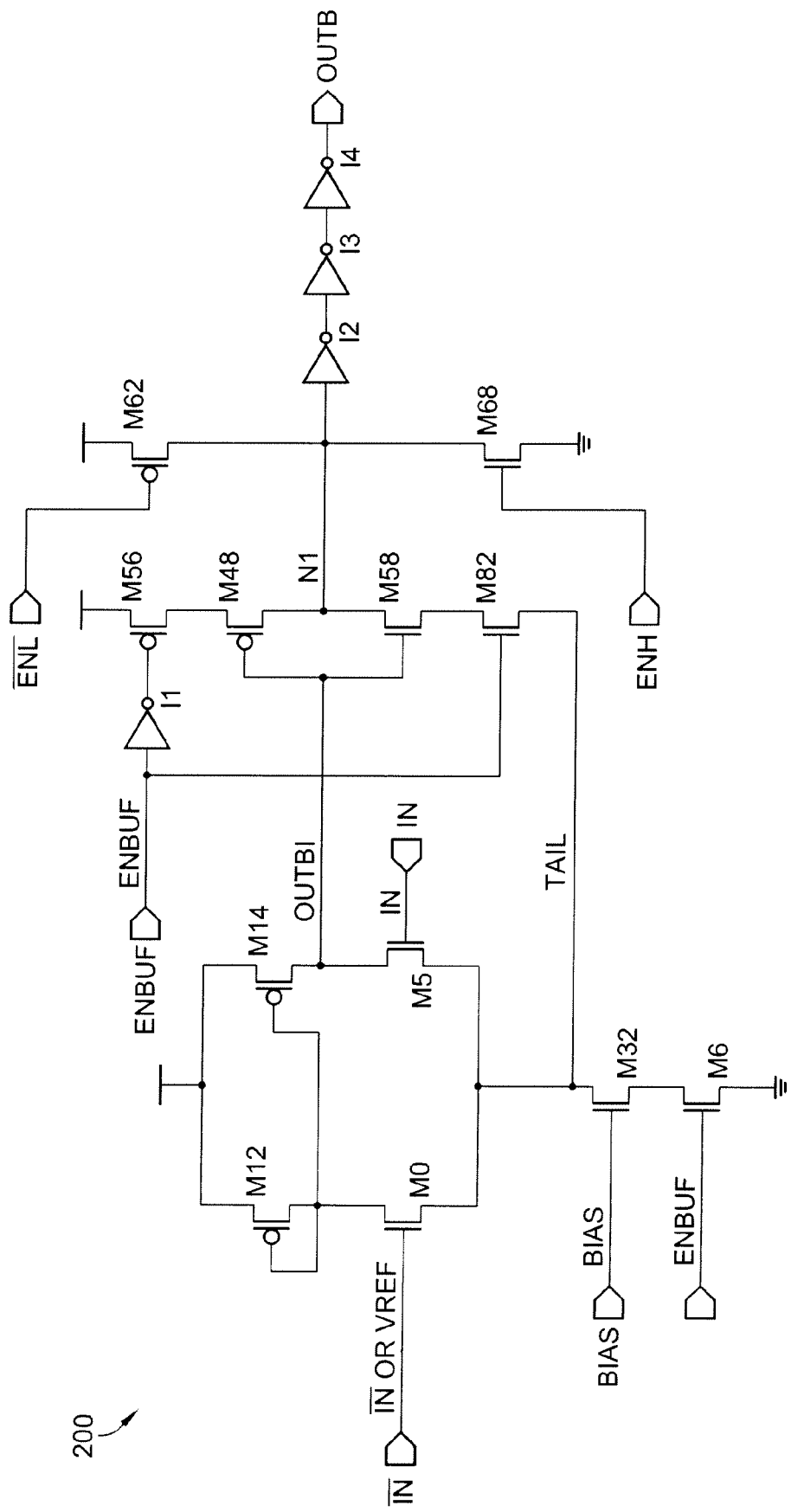
FIG. 2 is a schematic diagram of a circuit including a differential amplifier and a receiving inverter according to an embodiment of the present invention.

A differential amplifier connected to a receiving inverter has been modified to improve signal skew characteristics. The same transistor and node labels for the circuit 200 of the present invention shown in FIG. 2 are used as in FIG. 1. The circuit of an embodiment of the invention connects the TAIL node of the differential amplifier stage to the source of the N-Channel transistor (M82) of the first buffer stage (M56, M48, M58, and M82) which is driven on gates of transistors M48 and M58 by the differential amplifier output (OUTB). Transistors M56 and M82 are used to disable the drive on the first stage when in a standby condition, where either transistors M62 or M68 are enabled to drive the output, OUTB, to the desired standby state by signals ENL bar or ENH. When the stage is enabled, ENBUF is high, the trip point of the first inverter is altered via the TAIL connection on the source of transistor M82. In FIG. 2, note that the TAIL termination is used instead of the conventional VSS termination. Connecting the first inverter stage to the TAIL node provides a trip point tracking to the output low voltage level of the differential amplifier. The low level output of differential amplifier is the TAIL voltage plus the $V_{DS}$ of transistor M5. The high level output is typically very close to the VCC level. Therefore, the TAIL connection to the first inverter is used to adjust the trip point of the first inverter stage to compensate for the variations of the output voltage levels of the differential amplifier.

Additionally, the TAIL connection provides a small amount of regenerative feedback. When IN goes low, which results in a decrease of current through transistor M5 of the differential amplifier and an increase in current through transistors M0, M12, and then M14, forcing OUTBI (first inverter input) to be actively pulled high. The switching of current from transistor M5 to transistors M0, M12, and M14 occurs faster with the TAIL connection to the inverter due to the TAIL node being pulled up slightly when OUTBI starts a positive transition. This results in transistor M82 pulling the TAIL node via charge on node N1 and switching conduction through transistors M48 and M56. This feedback decreases the time delay of the low-to-high transition of OUTBI but has very little impact on the short delay transition of the differential amplifier.

The advantages of skew reduction, using the method described in this invention, are realized when either differential inputs (complementary inputs) or a single input signal referenced to a (switching point) reference level (VREF) are used. This invention is particularly beneficial when both types of inputs are used and low skew, between all transitions, must be maintained between outputs of differential buffer circuits using the two different input methods.

While there have been described above the principles of the present invention in conjunction with a specific circuit, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

I claim:

1. A low skew differential amplifier circuit comprising:
   a differential amplifier having a differential input, an output, and a tail node;
   an inverter having an input coupled to the output of the differential amplifier, an output, and a power terminal coupled to the tail node of the differential amplifier.

2. The differential amplifier circuit of claim 1 wherein the differential amplifier comprises a switch for selectively controlling a tail current of the differential amplifier.

3. The differential amplifier circuit of claim 1 wherein the inverter further comprises a switch for selectively controlling the operation of the inverter.

4. The differential amplifier circuit of claim 3 wherein the switch comprises a P-channel transistor and an N-channel transistor in series with the current path of the inverter.

5. The differential amplifier circuit of claim 1 further comprising at least one additional inverter coupled to the output of the inverter.

6. A method of providing a low skew output signal comprising:
   providing a differential amplifier having a differential input, an output, and a tail node;
   providing an inverter having an input coupled to the output of the differential amplifier, and an output, and;
   coupling a power terminal of the inverter to the tail node of the differential amplifier.

7. The method of claim 6 further comprising selectively controlling a tail current of the differential amplifier.

8. The method of claim 6 further comprising selectively controlling the operation of the inverter.

9. The method of claim 6 further comprising selectively switching the current path of the inverter.

10. The method of claim 6 further comprising coupling at least one additional inverter to the output of the inverter.

11. A low skew differential amplifier circuit comprising:
    a differential amplifier having a differential input, an output, and a tail node;
    an inverter having an input coupled to the output of the differential amplifier, and an output; and
    a bias circuit for providing current to the tail node of the differential amplifier and to a power terminal of the inverter.

12. The differential amplifier circuit of claim 11 further comprising a switch for selectively controlling the bias circuit.

13. The differential amplifier circuit of claim 11 wherein the inverter further comprises a switch for selectively controlling the operation of the inverter.

14. The differential amplifier circuit of claim 13 wherein the switch comprises a P-channel transistor and an N-channel transistor in series with the current path of the inverter.

15. The differential amplifier circuit of claim 11 further comprising at least one additional inverter coupled to the output of the inverter.

16. A method of providing a low skew output signal comprising:
    providing a differential amplifier having a differential input, an output, and a tail node;
    providing an inverter having an input coupled to the output of the differential amplifier, and an output, and;
    providing a bias current to the tail node of the differential amplifier and to a power terminal of the inverter.

17. The method of claim 16 further comprising selectively controlling the bias circuit.

18. The method of claim 16 further comprising selectively controlling the operation of the inverter.

19. The method of claim 16 further comprising selectively switching the current path of the inverter.

20. The method of claim 16 further comprising coupling at least one additional inverter to the output of the inverter.

21. A low skew differential amplifier circuit comprising:
    a differential amplifier; and
    an inverter coupled to the differential amplifier,
    wherein the switching point of the inverter tracks the midpoint of the output swing of the differential amplifier.

* * * * *